United States Patent
Bobek et al.

(10) Patent No.: US 12,211,673 B2
(45) Date of Patent: Jan. 28, 2025

(54) PROCESSING CHAMBER DEPOSITION CONFINEMENT

(71) Applicant: Applied Materials, Inc., Santa Clara, CA (US)

(72) Inventors: Sarah Michelle Bobek, Sunnyvale, CA (US); Venkata Sharat Chandra Parimi, Sunnyvale, CA (US); Sungwon Ha, Palo Alto, CA (US); Kwangduk Douglas Lee, Redwood City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1106 days.

(21) Appl. No.: 17/077,624

(22) Filed: Oct. 22, 2020

(65) Prior Publication Data

US 2022/0130650 A1    Apr. 28, 2022

(51) Int. Cl.
*H01J 37/32*    (2006.01)
*C23C 16/44*    (2006.01)
(Continued)

(52) U.S. Cl.
CPC .... *H01J 37/32834* (2013.01); *C23C 16/4412* (2013.01); *C23C 16/45521* (2013.01);
(Continued)

(58) Field of Classification Search
CPC .......... H01J 37/32834; H01J 37/32715; H01J 2237/3321; C23C 16/4412;
(Continued)

(56) References Cited

U.S. PATENT DOCUMENTS 11,443,926 B2 *  9/2022  Jeong .................. C23C 16/4412
11,646,184 B2 *  5/2023  Moon ............... H01J 37/32834
                                                                  118/715

(Continued)

FOREIGN PATENT DOCUMENTS

| JP | 2005-109342 A | 4/2005 |
|---|---|---|
| KR | 10-0943436 B1 | 2/2010 |
| KR | 2013-0074413 A | 7/2013 |

OTHER PUBLICATIONS

International Search Report and Written Opinion mailed Feb. 7, 2022 in International Patent Application No. PCT/US2021/055468, 8 pages.

*Primary Examiner* — Rudy Zervigon
(74) *Attorney, Agent, or Firm* — Kilpatrick Townsend & Stockton LLP

(57) ABSTRACT

Exemplary semiconductor processing systems may include a chamber body including sidewalls and a base. The system may include a substrate support extending through the base of the chamber body. The chamber body may define an access circumferentially extending about the substrate support at the base of the chamber body. The system may include one or more isolators disposed within the chamber body. The one or more isolators may define an exhaust path between the one or more isolators and the chamber body. The exhaust path may extend to the base of the chamber body. The systems may include a fluid source fluidly coupled with the chamber body at the access extending about the substrate support.

10 Claims, 5 Drawing Sheets

(51) Int. Cl.
  *C23C 16/455* (2006.01)
  *C23C 16/505* (2006.01)
  *H01L 21/02* (2006.01)
  *H01L 21/033* (2006.01)
  *H01L 21/67* (2006.01)

(52) U.S. Cl.
  CPC ...... *C23C 16/505* (2013.01); *H01J 37/32715* (2013.01); *H01L 21/02115* (2013.01); *H01L 21/02274* (2013.01); *H01L 21/0332* (2013.01); *H01L 21/67017* (2013.01); *H01L 21/6719* (2013.01); *H01J 2237/3321* (2013.01)

(58) Field of Classification Search
  CPC ............ C23C 16/45521; C23C 16/505; C23C 16/042; C23C 16/4408; C23C 16/4583; C23C 16/54; H01L 21/02115; H01L 21/02274; H01L 21/0332; H01L 21/67017; H01L 21/6719
  USPC ......................... 118/715; 156/345.33, 345.34
  See application file for complete search history.

(56) References Cited

U.S. PATENT DOCUMENTS

| | | | |
|---|---|---|---|
| 11,923,181 B2 * | 3/2024 | Moon | H01J 37/32449 |
| 2010/0147396 A1 * | 6/2010 | Yamagishi | H01L 21/67742 |
| | | | 137/15.01 |
| 2010/0279008 A1 * | 11/2010 | Takagi | C23C 16/45565 |
| | | | 118/725 |
| 2014/0287539 A1 * | 9/2014 | Ito | C30B 25/16 |
| | | | 118/712 |
| 2016/0222507 A1 | 8/2016 | Rocha-Alvarez et al. | |
| 2019/0122872 A1 * | 4/2019 | Ghosh | C23C 16/4408 |
| 2020/0126840 A1 * | 4/2020 | Roh | H01L 21/68764 |
| 2021/0002763 A1 * | 1/2021 | Pathak | C23C 16/4412 |
| 2021/0032747 A1 * | 2/2021 | Pathak | H01J 37/32862 |
| 2022/0307135 A1 * | 9/2022 | Pathak | C23C 16/4412 |

* cited by examiner

PROCESSING CHAMBER DEPOSITION CONFINEMENT

TECHNICAL FIELD

The present technology relates to components and apparatuses for semiconductor manufacturing. More specifically, the present technology relates to processing chamber components and other semiconductor processing equipment and methods.

BACKGROUND

Integrated circuits are made possible by processes which produce intricately patterned material layers on substrate surfaces. Producing patterned material on a substrate requires controlled methods for forming and removing material. Precursors are often delivered to a processing region and distributed to uniformly deposit or etch material on the substrate. Many aspects of a processing chamber may impact process uniformity, such as uniformity of process conditions within a chamber, uniformity of flow through components, as well as other process and component parameters. Even minor discrepancies across a substrate may impact the formation or removal process. Additionally, the components within the chamber may impact deposition on chamber components or edge and backside regions of a substrate support.

Thus, there is a need for improved systems and methods that can be used to produce high quality devices and structures. These and other needs are addressed by the present technology.

SUMMARY

Exemplary semiconductor processing systems may include a chamber body including sidewalls and a base. The system may include a substrate support extending through the base of the chamber body. The chamber body may define an access circumferentially extending about the substrate support at the base of the chamber body. The system may include one or more isolators disposed within the chamber body. The one or more isolators may define an exhaust path between the one or more isolators and the chamber body. The exhaust path may extend to the base of the chamber body. The systems may include a fluid source fluidly coupled with the chamber body at the access extending about the substrate support.

In some embodiments, the systems may include a pumping liner on which the one or more isolators is seated. The pumping liner may define a plurality of apertures providing fluid access to the exhaust path. The one or more isolators may include a first isolator seated on the pumping liner. A gap may be maintained between the substrate support and the first isolator proximate a substrate support surface of the substrate support. The gap may be maintained at less than or about 5 mm. The systems may include a liner plate seated on the one or more isolators. The liner plate may form a plenum at the base of the chamber body and within the chamber body. The plenum may be fluidly isolated from the access extending about the substrate support at the base of the chamber body. The fluid source may include nitrogen or oxygen.

Some embodiments of the present technology may encompass methods of semiconductor processing. The methods may include forming a plasma of a deposition precursor in a processing region of a semiconductor processing chamber. The methods may include flowing a purge gas through a gap defined between a substrate support and an isolator seated on a pumping liner within the processing region. The methods may include depositing material on a substrate seated on the substrate support. The methods may include exhausting deposition byproducts and purge gas through the pumping liner.

In some embodiments, the material deposited may be characterized by a nitrogen incorporation of less than or about 0.5%. The substrate support may extend at least partially above the pumping liner during the depositing. The semiconductor processing chamber may include a chamber body including sidewalls and a base. The substrate support may extend through the base of the chamber body. The chamber body may define an access circumferentially extending about the substrate support at the base of the chamber body. The isolator may include one or more isolators disposed within the chamber body. The one or more isolators may define an exhaust path between the one or more isolators and the chamber body. The exhaust path may be fluidly accessed through the pumping liner. The exhaust path may extend to the base of the chamber body.

In some embodiments, the gap may be maintained between the substrate support and a first isolator of the one or more isolators proximate a substrate support surface of the substrate support. The gap may be maintained at less than or about 5 mm. The semiconductor processing chamber may be incorporated within a semiconductor processing system may include a fluid source fluidly coupled with the chamber body at the access extending about the substrate support. The fluid source may be nitrogen or oxygen. The semiconductor processing chamber may include a liner plate seated on the one or more isolators. The liner plate may form a plenum at the base of the chamber body and within the chamber body. The plenum may be fluidly isolated from the access extending about the substrate support at the base of the chamber body.

Some embodiments of the present technology may encompass semiconductor processing systems. The systems may include a chamber body including sidewalls and a base. The systems may include a substrate support extending through the base of the chamber body. The chamber body may define an access circumferentially extending about the substrate support at the base of the chamber body. The systems may include a pumping liner. The pumping liner may be seated on the chamber body. The systems may include one or more isolators disposed within the chamber body. The one or more isolators may include a first isolator seated on the pumping liner. The one or more isolators may define an exhaust path between the one or more isolators and the chamber body. The exhaust path may extend to the base of the chamber body. The systems may include a fluid source fluidly coupled with the chamber body at the access extending about the substrate support. In some embodiments, the systems may include a liner plate seated on the one or more isolators. The liner plate may form a plenum at the base of the chamber body and within the chamber body. The plenum may be fluidly isolated from the access extending about the substrate support at the base of the chamber body.

Such technology may provide numerous benefits over conventional systems and techniques. For example, embodiments of the present technology limit deposition on chamber components such as a backside of a substrate support or support shaft. Additionally, some embodiments of the present technology may improve cleaning operations within the chamber. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
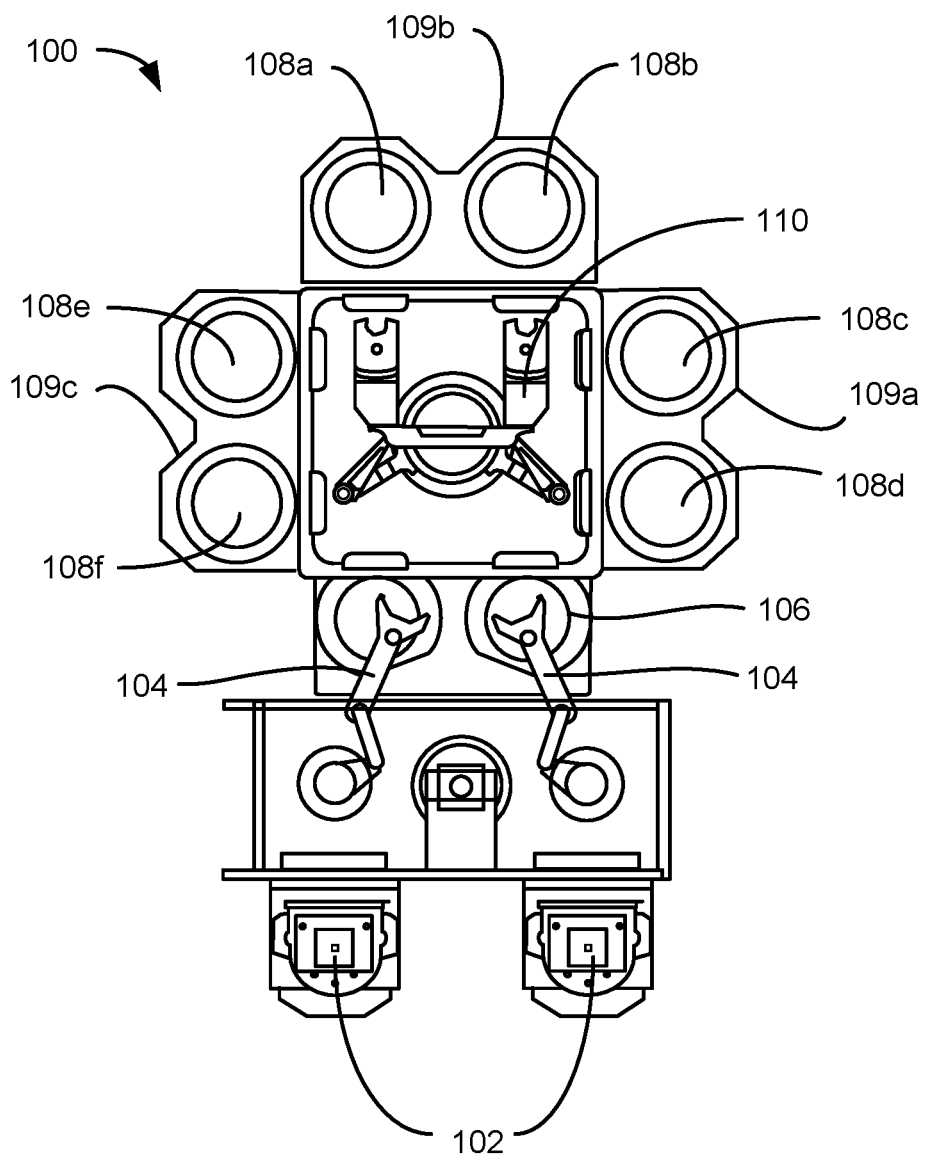
FIG. 1 shows a top plan view of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Plasma enhanced deposition processes may energize one or more constituent precursors to facilitate film formation on a substrate. Any number of material films may be produced to develop semiconductor structures, including conductive and dielectric films, as well as films to facilitate transfer and removal of materials. For example, hardmask films may be formed to facilitate patterning of a substrate, while protecting the underlying materials to be otherwise maintained. Additionally, other dielectric materials may be deposited to separate transistors on a substrate, or otherwise form semiconductor structures. In many processing chambers, a number of precursors may be mixed in a gas panel and delivered to a processing region of a chamber where a substrate may be disposed. While components of the lid stack may impact flow distribution into the processing chamber, many other process variables may similarly impact uniformity of deposition.

While lid stack components may beneficially distribute precursors into a processing region to facilitate uniform deposition, structures and operations to ensure more uniform coverage across the substrate may extend deposition into a number of regions about the chamber. For example, deposition precursors and products may be flowed through an exhaust system coupled at a base of the processing chamber. However, as many of these components may be maintained at a temperature lower or much lower than the substrate being processed, deposition materials may more readily condense or re-deposit on the substrate support shaft or chamber body walls. To address this issue, conventional technologies may be forced to increase timing for subsequent chamber cleaning processes after deposition. However, such a process may have multiple drawbacks. For example, accessing these regions of the chamber may be more challenging, which may cause increased cleaning times to be needed and may increase queue times, reducing throughput for the system. Additionally, these increased clean times may expose other chamber components to extended interactions with plasma effluents that may corrode the chamber or components more quickly.

The present technology overcomes these challenges by forming a gas distribution path through the processing chamber, which may draw deposition precursors and byproducts to an exterior region that may be isolated from the processing region. Additionally, a purge gas may be used to fill a volume beneath the substrate support, which may limit diffusion of deposition materials into this region of the chamber. By blocking deposition diffusion and forming a specific exhaust path from the chamber, cleaning operations can be improved by limiting cleaning performed in recessed regions, which may improve throughput.

Although the remaining disclosure will routinely identify specific deposition processes utilizing the disclosed technology, it will be readily understood that the systems and methods are equally applicable to other deposition and cleaning chambers, as well as processes as may occur in the described chambers. Accordingly, the technology should not be considered to be so limited as for use with these specific deposition processes or chambers alone. The disclosure will discuss one possible system and chamber that may include lid stack components according to embodiments of the present technology before additional variations and adjustments to this system according to embodiments of the present technology are described.

FIG. 1 shows a top plan view of one embodiment of a processing system 100 of deposition, etching, baking, and curing chambers according to embodiments. In the figure, a pair of front opening unified pods 102 supply substrates of a variety of sizes that are received by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f, can be outfitted to perform a number of substrate processing operations including formation of stacks of semiconductor materials described herein in addition to plasma-enhanced chemical vapor deposition, atomic layer deposition, physical vapor deposition, etch, pre-clean, degas, orientation, and other substrate processes including, annealing, ashing, etc.

The substrate processing chambers 108a-f may include one or more system components for depositing, annealing, curing and/or etching a dielectric or other film on the substrate. In one configuration, two pairs of the processing chambers, e.g., 108c-d and 108e-f, may be used to deposit dielectric material on the substrate, and the third pair of processing chambers, e.g., 108a-b, may be used to etch the deposited dielectric. In another configuration, all three pairs of chambers, e.g., 108a-f, may be configured to deposit stacks of alternating dielectric films on the substrate. Any one or more of the processes described may be carried out in chambers separated from the fabrication system shown in different embodiments. It will be appreciated that additional configurations of deposition, etching, annealing, and curing chambers for dielectric films are contemplated by system 100.

Figure 2:
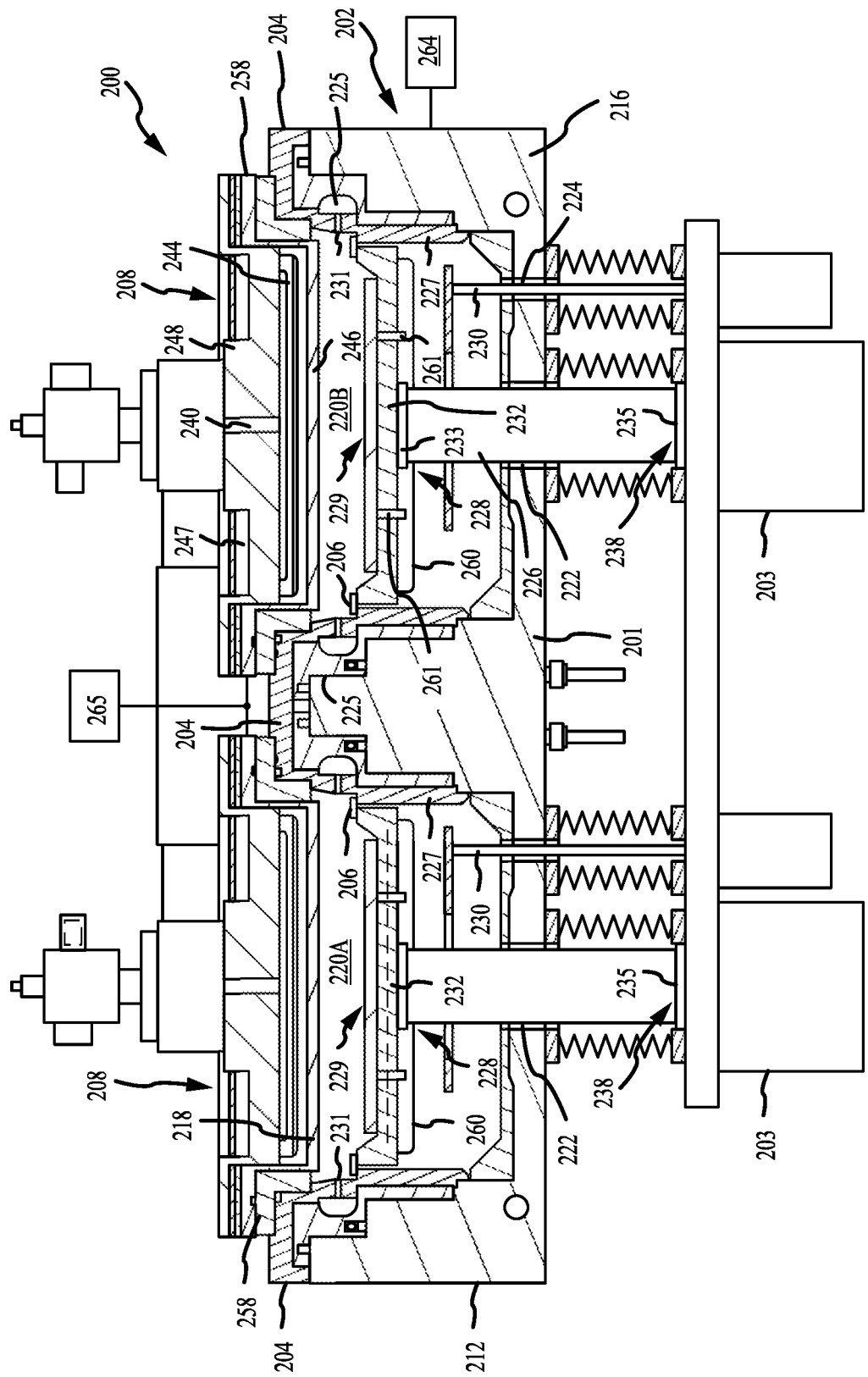
FIG. 2 shows a schematic cross-sectional view of an exemplary plasma system according to some embodiments of the present technology.

FIG. 2 shows a schematic cross-sectional view of an exemplary plasma system 200 according to some embodiments of the present technology. Plasma system 200 may illustrate a pair of processing chambers 108 that may be fitted in one or more of tandem sections 109 described above, and which may include faceplates or other components or assemblies according to embodiments of the present technology. The plasma system 200 generally may include a chamber body 202 having sidewalls 212, a bottom wall 216, and an interior sidewall 201 defining a pair of processing regions 220A and 220B. Each of the processing regions 220A-220B may be similarly configured, and may include identical components.

For example, processing region 220B, the components of which may also be included in processing region 220A, may include a pedestal 228 disposed in the processing region through a passage 222 formed in the bottom wall 216 in the plasma system 200. The pedestal 228 may provide a heater adapted to support a substrate 229 on an exposed surface of the pedestal, such as a body portion. The pedestal 228 may include heating elements 232, for example resistive heating elements, which may heat and control the substrate temperature at a desired process temperature. Pedestal 228 may also be heated by a remote heating element, such as a lamp assembly, or any other heating device.

The body of pedestal 228 may be coupled by a flange 233 to a stem 226. The stem 226 may electrically couple the pedestal 228 with a power outlet or power box 203. The power box 203 may include a drive system that controls the elevation and movement of the pedestal 228 within the processing region 220B. The stem 226 may also include electrical power interfaces to provide electrical power to the pedestal 228. The power box 203 may also include interfaces for electrical power and temperature indicators, such as a thermocouple interface. The stem 226 may include a base assembly 238 adapted to detachably couple with the power box 203. A circumferential ring 235 is shown above the power box 203. In some embodiments, the circumferential ring 235 may be a shoulder adapted as a mechanical stop or land configured to provide a mechanical interface between the base assembly 238 and the upper surface of the power box 203.

A rod 230 may be included through a passage 224 formed in the bottom wall 216 of the processing region 220B and may be utilized to position substrate lift pins 261 disposed through the body of pedestal 228. The substrate lift pins 261 may selectively space the substrate 229 from the pedestal to facilitate exchange of the substrate 229 with a robot utilized for transferring the substrate 229 into and out of the processing region 220B through a substrate transfer port 260.

A chamber lid 204 may be coupled with a top portion of the chamber body 202. The lid 204 may accommodate one or more precursor distribution systems 208 coupled thereto. The precursor distribution system 208 may include a precursor inlet passage 240 which may deliver reactant and cleaning precursors through a gas delivery assembly 218 into the processing region 220B. The gas delivery assembly 218 may include a gasbox 248 having a blocker plate 244 disposed intermediate to a faceplate 246. A radio frequency ("RF") source 265 may be coupled with the gas delivery assembly 218, which may power the gas delivery assembly 218 to facilitate generating a plasma region between the faceplate 246 of the gas delivery assembly 218 and the pedestal 228, which may be the processing region of the chamber. In some embodiments, the RF source may be coupled with other portions of the chamber body 202, such as the pedestal 228, to facilitate plasma generation. A dielectric isolator 258 may be disposed between the lid 204 and the gas delivery assembly 218 to prevent conducting RF power to the lid 204. A shadow ring 206 may be disposed on the periphery of the pedestal 228 that engages the pedestal 228.

An optional cooling channel 247 may be formed in the gasbox 248 of the gas distribution system 208 to cool the gasbox 248 during operation. A heat transfer fluid, such as water, ethylene glycol, a gas, or the like, may be circulated through the cooling channel 247 such that the gasbox 248 may be maintained at a predefined temperature. A liner assembly 227 may be disposed within the processing region 220B in close proximity to the sidewalls 201, 212 of the chamber body 202 to prevent exposure of the sidewalls 201, 212 to the processing environment within the processing region 220B. The liner assembly 227 may include a circumferential pumping cavity 225, which may be coupled to a pumping system 264 configured to exhaust gases and byproducts from the processing region 220B and control the pressure within the processing region 220B. A plurality of exhaust ports 231 may be formed on the liner assembly 227. The exhaust ports 231 may be configured to allow the flow of gases from the processing region 220B to the circumferential pumping cavity 225 in a manner that promotes processing within the system 200.

Figure 3:
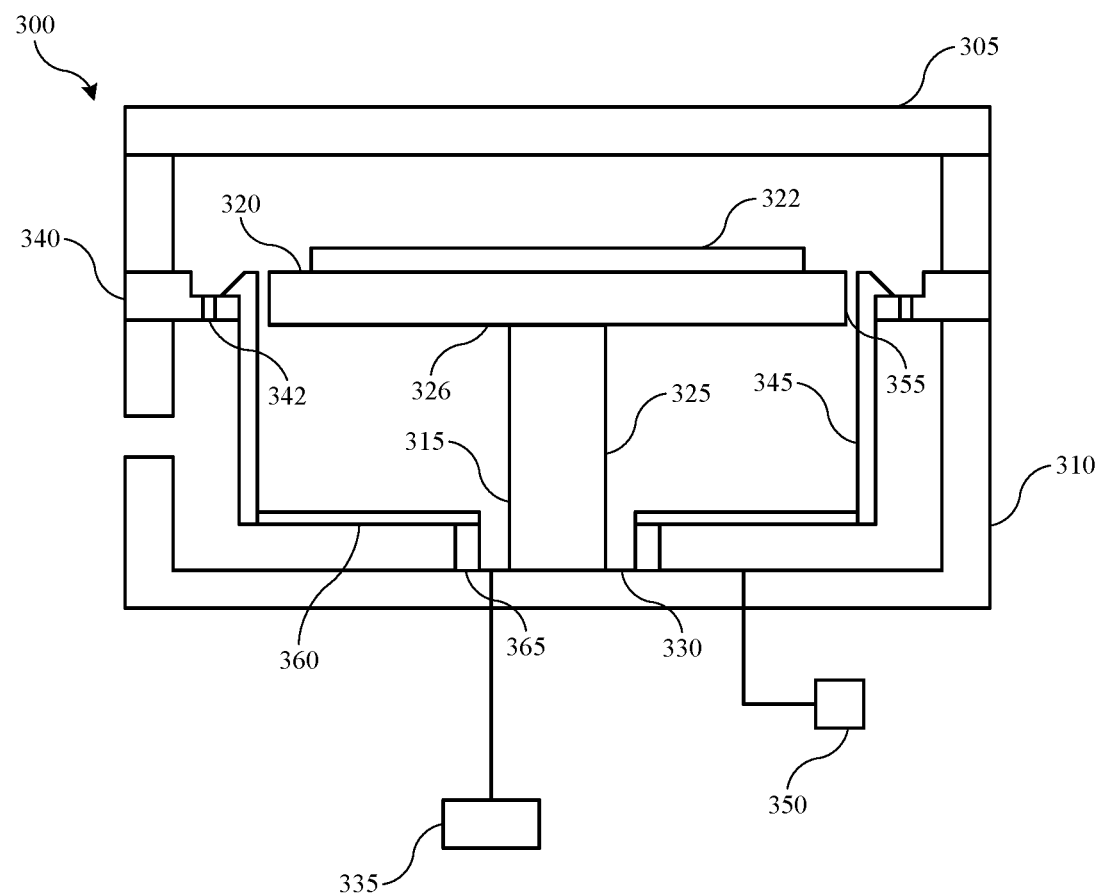
FIG. 3 shows a schematic partial cross-sectional view of an exemplary processing chamber according to some embodiments of the present technology.

FIG. 3 shows a schematic partial cross-sectional view of an exemplary processing system 300 according to some embodiments of the present technology. FIG. 3 may illustrate further details relating to components in system 200. System 300 is understood to include any feature or aspect of system 200 discussed previously in some embodiments. The system 300 may be used to perform semiconductor processing operations including deposition of hardmask materials or other materials as previously described, as well as other deposition, removal, or cleaning operations. System 300 may show a partial view of the chamber components being discussed and that may be incorporated in a semiconductor processing system, and may illustrate a view without several of the lid stack components noted above. Any aspect of system 300 may also be incorporated with other processing chambers or systems as will be readily understood by the skilled artisan.

System 300 may include a processing chamber including a faceplate 305, through which precursors may be delivered for processing, and which may be coupled with a power source for generating a plasma within the processing region of the chamber. The chamber may also include a chamber body 310, which as illustrated may include sidewalls and a base. A pedestal or substrate support 315 may extend through the base of the chamber as previously discussed. The substrate support may include a support platen 320, which may support semiconductor substrate 322. The support platen 320 may be coupled with a shaft 325, which may extend through the base of the chamber. Shaft 325 may provide access for a number of fluid and electrical connections, such as couplings for a heater or chuck, for example.

As illustrated, chamber body 310 may define an access 330 extending circumferentially about the substrate support, and which may be defined by the chamber body and/or with one or more additional components within the chamber. A fluid source 335 may be coupled with the access 330, and may be configured to deliver one or more purge materials through the access and into a volume defined at least partially by a backside of the substrate support platen. Although any inert or noble gas may be flowed through the access, as will be described below, in some embodiments the fluid source may deliver nitrogen and/or oxygen through the access to facilitate diffusion blocking about the substrate support.

System 300 may also include additional components that may cooperate to define an exhaust path from the processing chamber. While some conventional technologies may allow deposition materials to flow about the substrate support to an exhaust location at the bottom of the processing chamber, the present technology may form an exhaust path extending about the periphery of the chamber. As illustrated, in some embodiments system 300 may include a pumping liner 340 as part of the chamber body or seated on the chamber body, and which may extend about the substrate processing chamber. Although illustrated within an interior depth of the chamber body, faceplate 305 may also be seated directly on pumping liner 340 in some embodiments. Pumping liner 340 may define a plurality of apertures 342 about the liner, and which may provide fluid access to the exhaust path through the chamber. While the exhaust path may be defined by the chamber body 310 on an exterior side, one or more isolators 345 may be positioned within the processing chamber to define an interior wall of the exhaust path. Hence, an annular exhaust path may be formed extending about an exterior region of an interior volume of the processing chamber. The exhaust path may be defined between the chamber body and isolators. Access to the exhaust path may be provided by the apertures through the pumping liner 340, while egress from the exhaust path may occur through the base of the chamber. A pump or exhaust system 350 may be fluidly coupled with the exhaust path, which may allow materials to be exhausted from the processing chamber.

As will be described further below, the isolator 345 may include one or more annular components defining the exhaust path leading to the base of the chamber. Isolator 345 may be seated on a ledge defined on the pumping liner 340 at an interior edge. As illustrated, a bevel may be formed extending to an exterior edge of the isolator, which may seat on the pumping liner. It is to be understood that any other edge profile may be formed including a chamfer, grooved, or fillet edge profile. The edge profile may be adjusted to facilitate material flow from the processing region of the chamber, and limit deposition on components extending about an exterior of the processing region. Isolator 345 may be positioned to maintain a gap 355 between an exterior edge of the substrate support and an interior edge of the isolator, such as proximate the substrate support surface, or along a radial or exterior edge of the platen. Although the gap may be maintained at any size, in some embodiments the gap may be maintained at less than or about 5.0 mm to limit diffusion of deposition materials behind the substrate support platen, and the gap may be maintained at less than or about 4.5 mm, less than or about 4.0 mm, less than or about 3.5 mm, less than or about 3.0 mm, less than or about 2.5 mm, less than or about 2.0 mm, less than or about 1.5 mm, or less. However, the gap may be maintained wide enough to limit turbulence of flow of purge gas flowing up through the chamber to block diffusion, and thus in some embodiments the gap may be maintained at greater than or about 1.0 mm, greater than or about 1.5 mm, greater than or about 2.0 mm, or greater.

A liner plate 360 may be coupled with the isolator 345, and may form a plenum between the liner plate and the base of the chamber body. The plenum may be fluidly accessed by the exhaust system, which may remove materials from the processing chamber. An additional block or isolator 365 may extend between the base of the chamber body and the liner plate 360, and may extend about substrate support shaft 325. This may ensure that the purge path and access 330 about the substrate support shaft may be maintained fluidly isolated from the plenum formed between the base of the chamber and the liner plate. Accordingly, a purge flow path may be controlled to provide flow up through the access 330 in the chamber, through gap 355 to limit deposition diffusion, through apertures 342 in the pumping liner 340, and out through the exhaust system 350.

Figure 4:
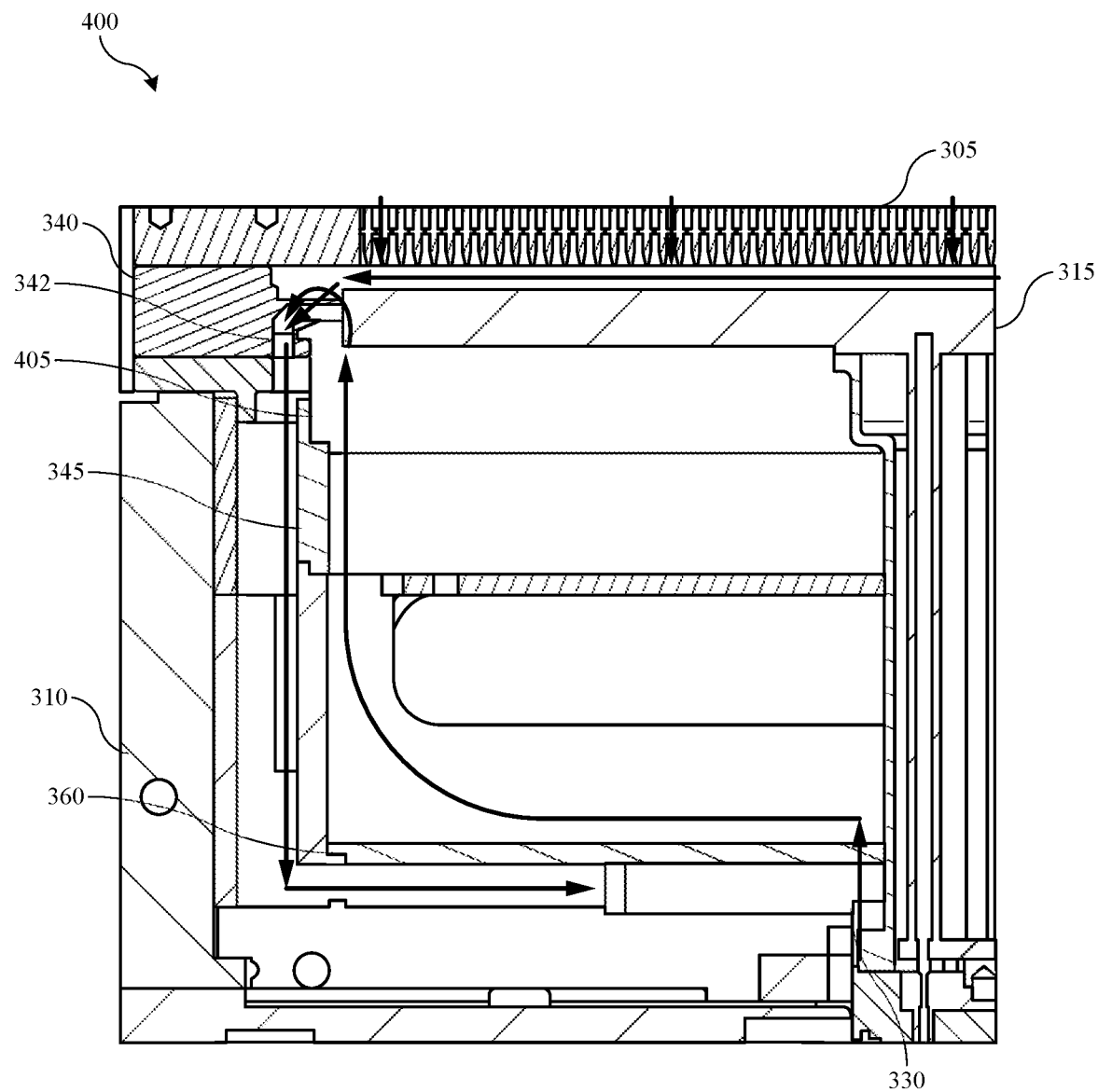
FIG. 4 shows a schematic partial cross-sectional view of an exemplary processing chamber according to some embodiments of the present technology.

FIG. 4 shows a schematic partial cross-sectional view of an exemplary processing chamber 400 according to some embodiments of the present technology. Chamber 400 may include any component, feature, or characteristic of system 300 or 200 as described above, and may illustrate additional features of chamber components of system 300. For example, as discussed above, faceplate 305 may be seated directly on pumping liner 340, which may be seated on the chamber body 310, such as on an additional isolator as illustrated. The pumping liner may define apertures 342 to provide fluid access into an exhaust path defined between the chamber body 310 and an isolator 345 structure within the chamber as illustrated. Additionally, in some embodiments, isolator 345 may include multiple components that may be joined or coupled to form the isolator structure. For example, a first isolator 405 may be seated on an interior ledge of the pumping liner 340, and may define a gap between an interior edge of the pumping liner and the exterior of the substrate support plate 315. A second isolator and a third isolated may also be included, which may extend towards the base of the processing chamber. The top interior edge of the first isolator 405 may define a lip or flange as illustrated to form a choke at any of the gap dimensions discussed above. A liner plate 360 may be seated on an interior ledge formed by the isolator 345, and may define a plenum with a pumping plate as illustrated, or the chamber base, and may also at least partially define the access 330, which may allow a purge material to be flowed into the volume beneath the substrate support.

Figure 5:
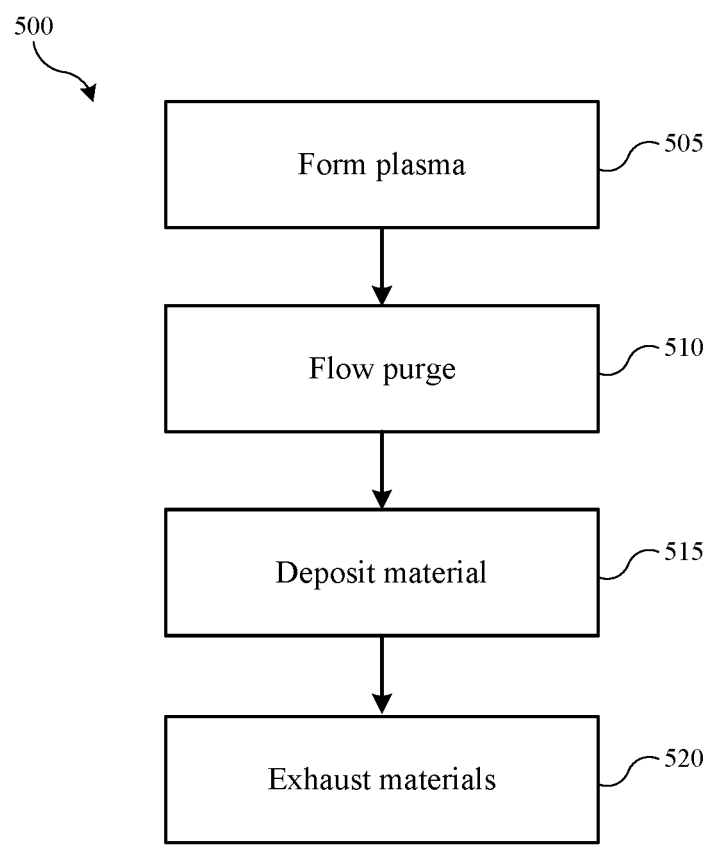
FIG. 5 shows operations of an exemplary method of semiconductor processing according to some embodiments of the present technology.

As explained previously, some embodiments of the present technology may produce a purge and exhaust flow path that may limit deposition on chamber components outside of a processing region defined between the substrate support and the faceplate. FIG. 5 shows operations of an exemplary method 500 of semiconductor processing according to some embodiments of the present technology. The method may be performed in a variety of processing chambers, including processing systems 200 and 300 described above, which may include any features or components defining purge and exhaust paths as previously described. Method 500 may include a number of optional operations, which may or may not be specifically associated with some embodiments of methods according to the present technology. For example, many of the operations are described in order to provide a broader scope of the technology, but are not critical to the technology, or may be performed by alternative methodology as would be readily appreciated.

Method 500 may include additional operations prior to initiation of the listed operations. For example, semiconductor processing may be performed prior to initiating method 500. Processing operations may be performed in the chamber or system in which method 500 may be performed, or processing may be performed in one or more other processing chambers prior to delivering the component into the cleaning system in which method 500 may be performed. Once a substrate has been received in a processing chamber, such as including some or all of components from system 300 described above, method 500 may include forming a plasma of one or more deposition precursors in a processing region of a semiconductor processing chamber at operation 505. The substrate may be positioned on a substrate support, such as support 315 described above, which may include any component, feature, or characteristic described above. During the formation, and including during a deposition operation, a purge gas may be flowed into an access through a base of the chamber at operation 510. The purge gas may be flowed through a volume below the substrate support, and may be flowed through a gap defined between the substrate support and an isolator seated on a pumping liner within the processing region, such as isolator 345, which may include first isolator 405 as discussed above.

From the plasma effluents of the one or more deposition precursors, a material may be deposited on the substrate at operation 515. Both residual deposition materials and byproducts, as well as purge gas, may be flowed into the exhaust path formed between the chamber body and the isolator through apertures in the pumping liner at operation 520. These materials may then be exhausted from the processing chamber. While conventional technologies may additionally deposit materials on a backside of the substrate support platen or the shaft of the pedestal, the present technology may limit diffusion of deposition materials into this volume by utilizing a defined exhaust path and flowing a purge gas as previously explained.

As noted above, any number of purge gases may be flowed through the access and gap in the chamber. For example, any noble gas including helium or argon, hydrogen, nitrogen, oxygen, or any other material may be flowed as the purge gas. However, in some embodiments the purge gas may be or include nitrogen or oxygen, which may limit parasitic plasma formation within the processing chamber. Argon may be characterized by a lower ionization potential, which when flowed through the gap into the capacitively-coupled plasma region, may ionize and form plasma discharge outside of the deposition plasma being formed, and which may affect deposition or cause damage to chamber components in some embodiments. Nitrogen and oxygen may be characterized by higher ionization energy, which may limit discharge at the gap region at an exterior edge of the substrate support.

Flow of the purge gas may impact aspects of deposition. For example, in one non-limiting example, a carbon hardmask may be deposited on a substrate utilizing processes and equipment according to embodiments of the present technology. In some embodiments the deposition precursors may be limited to a carbon-and-hydrogen-containing precursor, and or one or more carrier gases. Although nitrogen may not be actively flowed as a deposition precursor, a trace amount of nitrogen may naturally be incorporated within the film formed based on the environment. When utilizing nitrogen as a purge gas, nitrogen incorporation within the film may be increased at edge regions, which may impact operational performance of the mask material. To limit the amount of nitrogen incorporation, a flow rate of nitrogen as the purge gas may be limited to less than or about 2000 sccm of nitrogen introduced through the access in the chamber, and the flow rate may be limited to less than or about 1800 sccm, less than or about 1600 sccm, less than or about 1400 sccm, less than or about 1200 sccm, less than or about 1000 sccm, less than or about 800 sccm, less than or about 600 sccm, or less. However, depending on gap sizing as explained above, when purge gas flow rates are reduced, diffusion into the volume may be increased. Accordingly, in some embodiments the flow rate may be maintained at greater than or about 500 sccm, greater than or about 700 sccm, or more.

By controlling the nitrogen flow, the purge gas may be limited in the deposition region, which can limit incorporation within the film being deposited. Accordingly, in some embodiments, nitrogen incorporation in a carbon hardmask or other film may be limited to less than or about 0.50% at a depth of one micrometer at the edge region of the substrate, and may be limited to less than or about 0.45%, less than or about 0.40%, less than or about 0.35%, less than or about 0.30%, less than or about 0.25%, less than or about 0.20%, less than or about 0.15%, less than or about 0.10%, less than or about 0.05%, less than or about 0.03%, or less.

When oxygen is used as a purge gas, the oxygen may also interact with the plasma deposition. Again for the non-limiting example of a carbon hardmask, oxygen that may flow into the deposition region may etch portions of the carbon from the substrate. However, by controlling the flow rate at any of the rates as noted above, an etch may be maintained at a bevel or far edge region of the substrate, which may beneficially limit or reduce particle generation or edge peeling caused by deposition in these regions.

Where the substrate support is positioned relative to the pumping liner may also impact diffusion aspects of processes being performed. In some embodiments, the substrate may be maintained at a range of heights relative to the pumping liner, which may include in line with the pumping liner, above the pumping liner, or below the pumping liner, or at any plane through the pumping liner. However, this height relationships may impact deposition aspects, which may be accommodated by additional flow or gap adjustments. For example, when a substrate support surface of the substrate support is below a height of the pumping liner, the flow up to the pumping liner may cause more purge gas to flow towards the deposition region, which may incorporate additional material in the film. When the substrate support is above a height of the pumping liner, the flow may be directly pulled to the exhaust path, although deposition may occur on the exposed radial edges of the substrate support platen.

Once the substrate has been processed, the substrate may be removed from the chamber and a cleaning operation may be performed. The purge gas may be reduced or halted during the cleaning operation, which may allow cleaning effluents to access the volume to remove an amount of diffusion of deposition materials that may have occurred. Because diffusion of deposition materials may be limited according to embodiments of the present technology, improved throughput may be afforded due to reduced cleaning times.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "an aperture" includes a plurality of such apertures, and reference to "the fluid" includes reference to one or more fluids and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

What is claimed is:

1. A semiconductor processing system, comprising:
   a chamber body comprising sidewalls and a base;
   a substrate support extending through the base of the chamber body, wherein the chamber body defines an access circumferentially extending about the substrate support at the base of the chamber body;
   one or more isolators disposed within the chamber body, wherein the one or more isolators define an exhaust path between the one or more isolators and the chamber body, and wherein the exhaust path extends to the base of the chamber body; and
   a fluid source fluidly coupled with the chamber body at the access extending about the substrate support.

2. The semiconductor processing system of claim 1, further comprising:
   a pumping liner on which the one or more isolators is seated, wherein the pumping liner defines a plurality of apertures providing fluid access to the exhaust path.

3. The semiconductor processing system of claim 2, wherein the one or more isolators comprises a first isolator seated on the pumping liner.

4. The semiconductor processing system of claim 3, wherein a gap is maintained between the substrate support and the first isolator proximate a substrate support surface of the substrate support.

5. The semiconductor processing system of claim 4, wherein the gap is maintained at less than or about 5 mm.

6. The semiconductor processing system of claim 1, further comprising:
   a liner plate seated on the one or more isolators, wherein the liner plate forms a plenum at the base of the chamber body and within the chamber body.

7. The semiconductor processing system of claim 6, wherein the plenum is fluidly isolated from the access extending about the substrate support at the base of the chamber body.

8. The semiconductor processing system of claim 1, wherein the fluid source comprises nitrogen or oxygen.

9. A semiconductor processing system, comprising:
   a chamber body comprising sidewalls and a base;
   a substrate support extending through the base of the chamber body, wherein the chamber body defines an access circumferentially extending about the substrate support at the base of the chamber body;
   a pumping liner, wherein the pumping liner is seated on the chamber body;
   one or more isolators disposed within the chamber body, wherein the one or more isolators comprises a first isolator seated on the pumping liner, wherein the one or more isolators define an exhaust path between the one or more isolators and the chamber body, and wherein the exhaust path extends to the base of the chamber body; and
   a fluid source fluidly coupled with the chamber body at the access extending about the substrate support.

10. The semiconductor processing system of claim 9, further comprising:
    a liner plate seated on the one or more isolators, wherein the liner plate forms a plenum at the base of the chamber body and within the chamber body, wherein the plenum is fluidly isolated from the access extending about the substrate support at the base of the chamber body.

* * * * *